United States Patent [19]

Yamada

[11] 3,944,989
[45] Mar. 16, 1976

[54] PATTERN INFORMATION MEMORY USING CIRCULATING MEMORIES

[75] Inventor: Minoru Yamada, Gotenba, Japan

[73] Assignee: Takachiho Koeki Kabushiki Kaisha, Japan

[22] Filed: June 16, 1975

[21] Appl. No.: 586,928

Related U.S. Application Data

[63] Continuation-in-part of Ser. No. 416,654, Nov. 16, 1973.

[30] Foreign Application Priority Data

Nov. 17, 1972 Japan.............................. 47-115437

[52] U.S. Cl. ............................................ 340/172.5
[51] Int. Cl.² ..................... G11C 7/00; G11C 21/00
[58] Field of Search.......................... 340/172.5, 324; 354/5–19

[56] References Cited
UNITED STATES PATENTS

| | | | |
|---|---|---|---|
| 3,351,917 | 11/1967 | Shimabukuro................... | 340/172.5 |
| 3,388,383 | 6/1968 | Shivdasani et al.............. | 340/172.5 |
| 3,422,419 | 1/1969 | Mathews et al.................. | 340/172.5 |
| 3,546,681 | 12/1970 | Korn et al......................... | 340/172.5 |
| 3,626,824 | 12/1971 | Kolb et al........................ | 340/324 X |
| 3,697,958 | 10/1972 | Larew............................... | 340/172.5 |

*Primary Examiner*—Harvey E. Springborn
*Assistant Examiner*—Paul R. Woods
*Attorney, Agent, or Firm*—Robert E. Burns; Emmanuel J. Lobato; Bruce L. Adams

[57] ABSTRACT

A pattern information memory, provided with a font memory having a total bit capacity of $n \cdot A$ and comprising a number A of circulating memories each having a rewritable $n$-bit capacity, each bit being capable of storing one dot obtained by dot decomposition from each unit pattern. A minimum unit of designated addresses in the font memory is switched in accordance with a value of a number $m$ ($m = 1, 2, 3, \ldots$ less than the number A) to provide a memory capacity of $(n \cdot A)/(n \cdot m)$ patterns in combination of a number $m$ of said circulating memories per each pattern of $n \cdot m$ dots. Writing and reading-out are performed by making once access to a number $m$ of said circulating memories within a unit access time for one bit in a case : $m=1$. Accordingly, the writing and the reading-out for each pattern information are performed in a constant period of time irrespective of the value of the number $m$.

2 Claims, 6 Drawing Figures

PATTERN INFORMATION MEMORY USING CIRCULATING MEMORIES

This application is a continuation-in-part of Ser. No. 416,654, filed Nov. 16, 1973.

This invention relates to a pattern information memory employed for character display or the like.

In conventional pattern display, such as character display, if the number of dots per each character pattern is increased for enchancement of the quality of the character pattern by a serial increase of circulating memories, the following defects have been caused.

1. If the transmission speed is constant, the transmission time is extended by a time corresponding to the number of increased bits.

2. In order to complete the transmission of one character within a certain predetermined period of time, it is necessary to raise the transmission speed.

The above defect (1) implies that the deflection control of the display must be changed in accordance with the number of dots per one character pattern. The defect (2) implies that a change of the shift clock timing of the circulating memory is required and that the performance of the retained transmission speed cannot be exhibited to a maximum at all times.

Further, in a conventional read-only memory, it is remarkedly difficult to change the stored character pattern. For example, in a case where the required character quality is low, it is impossible to achieve on operation of storing a new character pattern in the empty bit capacity left over by the low quality. Because of such limitations as mentioned above, a character pattern information memory capable of easy selection of the character quality, which is answerable to the requirement of selecting the high character quality or the large number of characters in a character display unit, has not yet been realized.

An object of this invention is to provide a pattern information memory capable of having, without changing the shift clock timing of individual circulating memories and regardless of the number of dots per one unit pattern information, a constant display time of one unit pattern at all times and capable of adopting the address control for utilizing a maximum bit capacity of the memory.

This invention will hereinafter be described in detail below with reference to the accompanying drawings: in which.

Figure 1A:
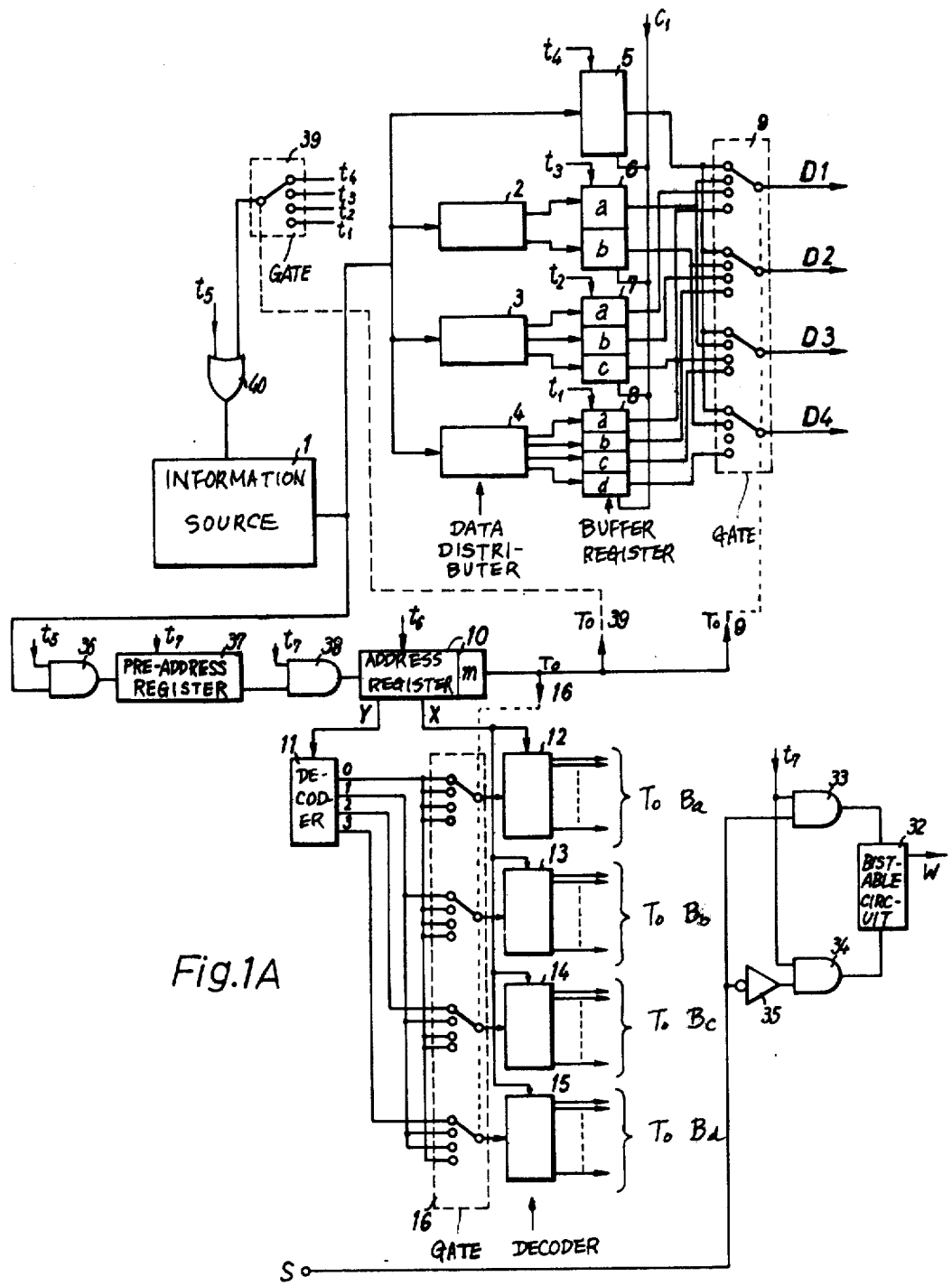
FIGS. 1A and 1B are block diagrams illustrating, in combination, an embodiment of this invention.
Figure 1B:
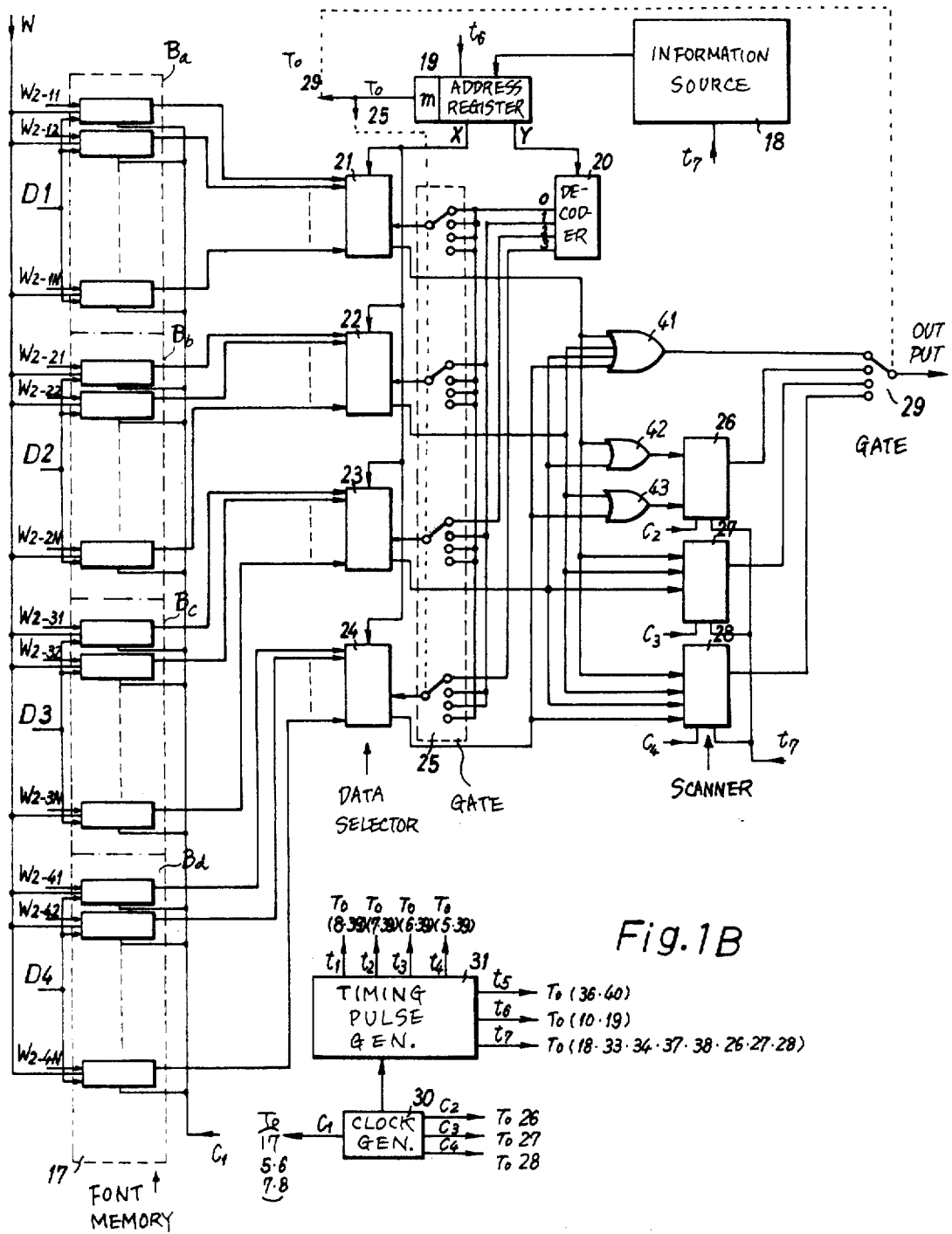
Figure 2:
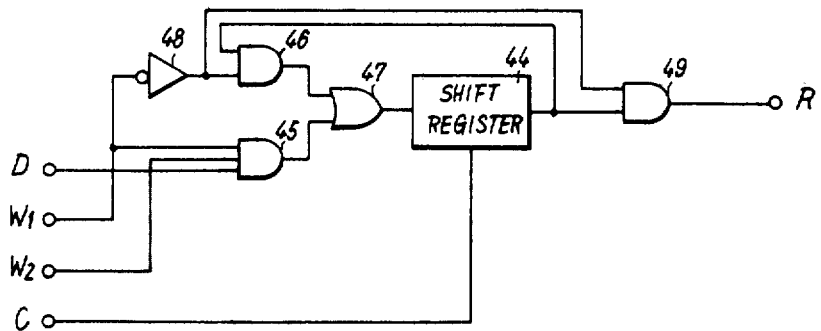
FIG. 2 is a circuit diagram illustrating an example of a circulating memory employed in the embodiment shown in FIG. 1B.

With reference to FIGS. 1A, 1B and FIG. 2, an example of a font memory employed in this invention will first be described. In this example, a number of bits per one character can be set to one of four steps of $n$, $2n$, $3n$ and $4n$. A font memory 17 comprises N number of circulating memories, which are divided into four memory blocks B$a$, B$b$, B$c$ and B$d$. Each rectangle section included in each memory block B$a$, B$b$, B$c$ or B$d$ represents a circulating memory, so that each memory block B$a$, B$b$, B$c$ or B$d$ includes N/4 number of circulating memories.

Each of the circulating memories comprises, for example, a shift register 44 of four bits, AND gates 45, 46 and 49, an OR gate 47, an inverter 48, and five terminals D, $W_1$, $W_2$, C and R. The elements 45, 46, 47, 48 and 49 are employed for switching the write mode and the read mode to each other. This circulating memory shown in FIG. 2 can be formed into a chip of LSI. The terminal D receives character information data. The terminal $W_1$ receives a mode selecting signal for selecting the write mode or the read mode. The terminal $W_2$ receives a chip selecting signal for selecting the instant circulating memory at the write mode. The terminal C receives shift clock pulses. The terminal R provides character pattern information at the read mode. In case of writing character pattern information of $n$-bits into the circulating memory, the character information of $n$-bits is applied to the terminal D while the AND gate 45 is opened in response to true states of the terminals $W_1$ and $W_2$ during periods of $n$ shift clock pulses. In this case, the output of the AND gate 45 passes through the OR gate 47 and are then applied to the shift register 44, so that the character pattern information applied to the terminal D is stored per one bit in the shift register 44 through the AND gate 45 and the OR gate 47 in synchronism with the shift clock pulses applied from the terminal C. The output of the inverter 48 assumes the false state so as to close the AND gate 46 and 49 in this case, so that the output of the shift register 44 is not applied to the terminal R. When n-bits of information are just stored in the shift register 44, the terminal $W_1$ assumes the false state to switch the circulating memory into the read mode so that the AND gates 45 and 46 are turned to the close state and the opened state respectively. Since the output of the register 44 is applied to the AND gate 46, the output of the AND gate 46 is again applied to the register 44 through the OR gate 47. Accordingly, a closed loop is formed by the elements 44, 46 and 47. In this case, the AND gate 49 is opened so that the character information stored in the register 44 is sent out to the terminal R for one bit in synchronism with the shift clock pulses. As mentioned above, this circulating memory assumes essentially the write mode or the read mode. Since the shift clock pulses of constant period are always applied to the terminal C to shift the shift register 44, each of the stored bits in the shift register 44 is read out for $n$ clock pulses at the read mode.

If the same clock pulses are simultaneously applied to all the terminals C of N number of the circulating memories, n information blocks each including $n$-bits of information circulate in parallel in the font memory 17. The terminals $W_1$, $W_2$ and C receive the same signals as those of other circulating memories respectively.

Figure 3:
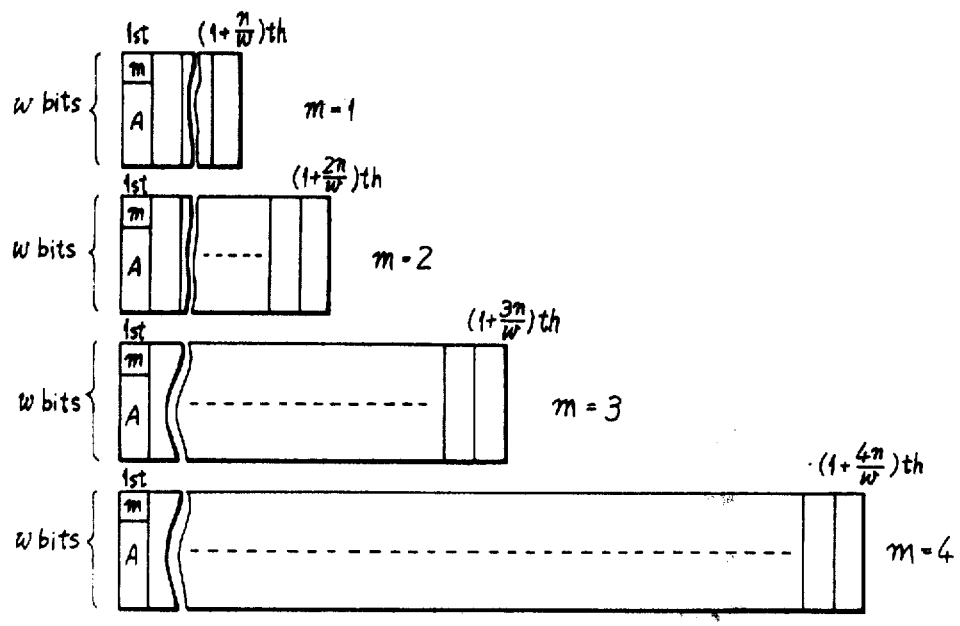
FIG. 3 shows diagrams illustrating examples of the signal configuration of information stored in an information source employed in FIG. 1A.

The font memory 17 is so designed that character pattern information of $2n$ bit, $3n$ bits or $4n$ bits can be written in or read out in one circulating period of the circulating memory. In other words, each character pattern information is distributed into two, three or four circulating memories for n-bits under the predetermined principle, so that each $2n$, $3n$ or $4n$ bit character pattern information of high bit density can be generated in the read mode by scanning the two, three or four circulating memories in synchronism with the one-half, one-third or one-fourth periods of the shift clock pulses in accordance with the same predetermined principle as mentioned above. In this case, if conditions where each character pattern information is indicated by $n$-bits, $2n$-bits, $3n$-bits, or $4n$-bits are assumed as $m=1$, $m=2$, $m=3$ and $m=4$ respectively, one, two, three, or four circulating memory or memories is/are simultaneously scanned. In FIG. 1B, the terminals $W_2$ for all the circulating memories are indicated by references $W_{2-11}$, $W_{2-12}$, ... $W_{2-1N}$, $W_{2-21}$, $W_{2-22}$, ... $W_{2-2N}$, $W_{2-31}$, $W_{2-3N}$, $W_{2-41}$, $W_{2-42}$, ... $W_{2-4N}$. In each block Ba, Bb, Bc or Bd of the circulating memories, one of N terminals $W_2$ assumes the "true" state for a designated address in case of $m=1$. In case of $m=2$, one of terminals $W_2$ in the memory blocks Ba and Bc assumes the true state in addition to one of terminals $W_2$ in the memory blocks Bb and Bd. In case of $m=3$, one of terminals $W_2$ in each memory blocks Ba, Bb and Bc assumes the true state. In case of $m=4$, one of terminals $W_2$ in each memory blocks Ba, Bb, Bc and Bd assumes the true state. In FIG. 1A, circuit elements provided in relation to the write mode operation are illustrated. In FIG. 1A, an information source 1 stores therein pattern information of a number of desired characters, which have signal configurations as shown in FIG. 3. Each pattern information is divided into a plurality of information blocks, each of which is formed by $w$-bits. A first block of $w$-bits in each pattern information is an address code word, which designates the address of the font memory 17 to store the instant pattern information therein. In this case, an area $m$ is provided for indicating a value of $m$, while an area A is provided for the address. The value of $m$ predetermined by an operator in accordance with the desired character quality is stored in the area $m$. The pattern information to be stored in the successive information blocks is provided in accordance with the desired character quality. As shown in FIG. 3, $n/w$ blocks, $2n/w$ blocks, $3n/w$ blocks and $4n/w$ blocks are provided for the cases $m=1$, $m=2$, $m=3$ and $m=4$ respectively in addition to one address code word mentioned-above. The $w$-bits of information in each information blocks are sent out in the parallel configuration.

An address register 10 temporarily stores the address code word during periods of $n$ clock pulses of the font memory 17. The address parts X and Y of the stored address code word are respectively applied to a decoder 11 and decoders 12, 13, 14 and 15. Each of the address decoders 12, 13, 14 and 15 provides N/4 output terminals, which are respectively connected to the terminals $W_2$ of the circulating memories of the memory blocks Ba, Bb, Bc and Bd. The address part X of the address code word is commonly applied to the decoders 12, 13, 14 and 15. The address part Y is decoded by the decoder 11 into four digits, which are individually selected by four selectors in a gate 16 to apply them to the other inputs of the decoders 12, 13, 14 and 15 respectively. Accordingly, when an address code word is stored in the address register 10, the address part Y thereof selects one of the decoders 12, 13, 14 and 15, while outputs of one of the address decoders 12, 13, 14 and 15 selected by the address part X assume the true states. The selectors in the gate 16 are formed as shown in FIG. 1A, so that only one of the decoders 12, 13, 14 and 15 is selected in case of $m=1$ in accordance with the address part Y; two (12, 13; or 14, 15) of the decoders 12, 13, 14 and 15 being simultaneously selected in case of $m=2$; three of the decoders 12, 13, 14 and 15 being simultaneously selected in case of $m=3$; all of the decoders 12, 13, 14 and 15 being simultaneously selected in case of $m=4$.

The information blocks of the character pattern information succeeding to the address code word are, directly or through one of data distrubuters 2, 3 and 4, sent to one of buffer registers 5, 6, 7 and 8 in the parallel signal configuration. The buffer register 5 comprises a serial-in parallel-out register of $w$-bits. The buffer register 6 comprises two serial-in parallel out register $a$ and $b$ of $w/2$ bits. The buffer register 7 comprises three serial-in parallel-out registers $a$, $b$ and $c$ of $w/3$ bits. The buffer register 8 comprises four serial-in parallel-out register of $w/4$ bits. The data distributer 2 is employed for successively distributing the information blocks from the information source to the registers $a$ and $b$ of the buffer register 6. The data distributer 3 is employed for successively distributing the information blocks from the information source 1 to the registers $a$, $b$ and $c$ of the register 7. The distributer 4 is employed for successively distributing the information blocks from the information source 1 to the registers $a$, $b$, $c$ and $d$ of the register 8. Output terminals of the serial-in parallel-out register 5, 6, 7 and 8 are connected to input terminals of four selectors in a gate 9, which is controlled by the above mentioned value of $m$ in the address register 10, so that four parallel outputs $D_1$, $D_2$, $D_3$ and $D_4$ are obtained from the gate 9 to be respectively applied to the memory blocks Ba, Bb, Bc and Bd of the font memory 17. In case of $m=1$, all the outputs $D_1$, $D_2$, $D_3$ and $D_4$ are supplied from the buffer register 5. In case of $m=2$, the output of the register $a$ of the buffer register 6 is supplied to the outputs $D_1$ and $D_3$, while the outputs $D_2$ and $D_4$ are supplied from the register $b$ of the buffer register 6. In case of $m=3$, the outputs $D_1$, $D_2$ and $D_3$ are respectively supplied from the registers $a$, $b$ and $c$ of the buffer register 7. In case of $m=4$, the outputs $D_1$, $D_2$, $D_3$ and $D_4$ are respectively supplied from the registers $a$, $b$, $c$ and $d$ of the buffer register 8.

A gate 39 switches the access time to the information source 1. The gates 6, 9 and 39 are simultaneously controlled by signal obtained by detecting the value of $m$ in the address register 10. If the value of $m$ is constant for each application during a relatively long time, the gates 6, 9 and 39 may be manually controlled. A pre-address register 37 temporarily stores the output of the information source 1 to synchronize with the write timing of the first bit of the character pattern information with the write enable timing of the circulating memories in the font memory 17. AND gates 36 and 38 are employed for setting the address code word in the pre-address register 37 and the address register 10 respectively. The setting to the pre-address register 37 can be performed in case where the address code word is stored in the information source 1. The setting to the address register 10 can be performed in case where the address code word is stored in the pre-address register 37. An OR gate 40 provides a signal for actuating the access operation to both the address code word and the character pattern information. A terminal S receives a mode signal for designating the write mode or the read mode. A bistable circuit 32 is set in response to the true state of the mode signal when an AND gate 33 is satisfied, so that the output W of the bistable circuit 32 is applied to the terminal $W_1$ of the circulating memory in the font memory 17. The mode signal is inverted by an inverter 35, so that the bistable circuit 32 is reset in response to the "false" state of the mode signal when an AND gate 34 is satisfied.

In FIG. 1B, the font memory 17, a clock generator 30, a timing pulse generator 31 and circuits relating to the read mode are shown. The clock generator 30 generates four clock pulse trains $C_1$, $C_2$, $C_3$ and $C_4$, which has the following relation in period:

$$C_1 = 2C_2 = 3C_3 = 4C_4$$

Figure 4:
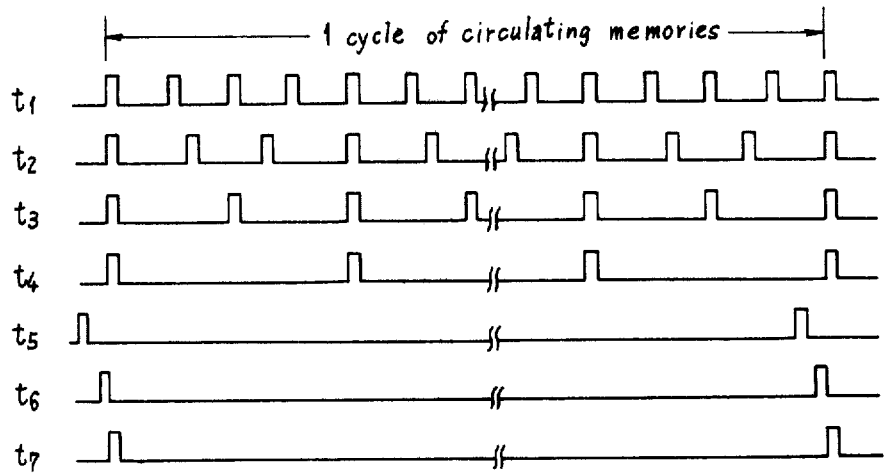
FIG. 4 shows time charts illustrating timing pulse trains generated from a timing pulse generator employed in FIG. 1B.

The clock pulse train $C_1$ is employed as the shift clock pulses of the circulating memories in the font memory 17. The timing pulse generator 31 comprises a binary counter and a plurality of gates and generates seven timing pulse trains $t_1$, $t_2$, $t_3$, $t_4$, $t_5$, $t_6$ and $t_7$. One counting cycle of the binary counter corresponds to $n$ periods of the clock pulses $C_1$. Each of the timing pulse trains $t_5$, $t_6$ and $t_7$ is once generated in one counting cycle of the binary counter. Each of other timing pulses are plural times generated in one counting cycle of the binary counter. The timing pulses $t_1$, $t_2$, $t_3$ and $t_4$ are generated for $w/4$ pulses, $w/3$ pulses, $w/2$ pulses and $w$ pulses of the clock pulse train $C_1$ respectively, so that any of the timing pulses $t_1$, $t_2$, $t_3$ and $t_4$ causes the access to the information source 1 to parallelly set the selected character pattern information in the buffer registers 5, 6, 7 and 8. The timing pulses $t_1$ to $t_7$ are shown in FIG. 4 by way of example, which corresponds to one cyclic period of the timing pulse generator 31 and to one circulating period of each circulating memory in the font memory 17.

The character pattern information derived from the information source 1 for *bits is* is written in the font memory 17 as follows. The operation will be described in case of $m=2$.

At the onset $w$-bits of $2n$-bits character pattern information are derived from the information source 1 in response to a first timing pulse $t_3$ in a character scale corresponding to $n$ pulses of the clock pulse train $C_1$ and then parallelly set in the registers $a$ and $b$ of the buffer register 6 for $w/2$ bits through the date distributer 2. Since this first pulse of the timing pulses $t_3$ is synchronized with a first pulse of the timing pulses $t_7$, an address code word previously set in the pre-address register 37 in response to the timing pulse $t_5$ is also set in the address register 10 in the same first pulse of the timing pulses $t_3$. Accordingly, a write enabling timing of one circulating memory of the memory blocks B$a$ or B$c$ and of one circulating memory of the memory blocks B$b$ or B$d$ corresponds to the set timing of the outset $w$-bits of the character pattern information in the buffer register 6. The registers $a$ and $b$ of the buffer register 6 send out its contents of $w/2$ bits for one bit in synchronism with pulses of the clock pulse train $C_1$ to write them for one bit in the write-enabled two circulating memories.

When contents of the registers $a$ and $b$ of the buffer register 6 are completely read out in response to $w/2$ pulses of the clock pulse train $C_1$, second $w$-bits of the selected character pattern information are derived from the information source 1 in response to a second pulse of the timing pulse train $t_3$ and then set in the buffer register 6. The character pattern information of $2n/w$ units configuration of $w$-bits is transferred to the font memory in the above successive manner in response to $2n/w$ pulses of the timing pulse train $t_3$.

The timing pulse $t_5$ is employed for setting the address code word to the pre-address register 37 before the timing pulse $t_7$ employed for setting the address code word in the address register 10. The timing pulse $t_6$ is employed for resetting the address register just before the setting the address code word in the same address register 10. The timing pulse $t_7$ is a start timing pulse of one circulating period of each circulating memory in the font memory 17 and also employed for a switching timing of the write mode and the read mode. Moreover, the timing pulse $t_7$ resets the pre-address register 37 simultaneously with the set timing of the address register 10.

The read mode operation is performed as follows. An address code word is provided in the information source 18 for a character pattern to be read out from the font memory 17. The format of this address code word is the same as the first information block of one character pattern information and is of $w$-bits formed by the address part and a part indicative of a value of $m$. If the address parts are equal to each other, the value of $m$ is also equal to that of the information source 1. Inputs of data selectors 21, 22, 23 and 24 are respectively connected to outputs of circulating memories of the font memory 17. When an address code word is now derived from the information source 18 to the address register 19 in response to the timing pulse $t_7$, the character pattern information stored in the circulating memories is provided at the outputs of the data selectors 21, 22, 23 and 24 in accordance with a combination of the decoder 20 and a gate 25 for each information block of the designated address. The gate 25 is switched together with a gate 29 in accordance with the value of $m$ of the address code word stored in the address register 19. If $m=1$, the information block of the designated address is one, the output of only one circulating memory in the font memory is selected and bit-serially sent out through the gate 29. In case of $m=2$, a circulating memory connected to either the data selector 21 or 23 and a circulating memory connected to either the date selector 22 or 24 send out their outputs to the two inputs of a scanner 26 respectively. The scanner 26 performs the scanning of the two inputs to provide bit-serial character pattern information of $2n$ bits. In case of $m=3$ or $m=4$, three of four circulating memories are scanned by a scanner 27 or a scanner 28 to provide bit-serial character pattern information of $3n$ bits or $4n$-bits. The clock pulse trains $C_2$, $C_3$ and $C_4$ determine the respective scanning speeds of the scanners 26, 27 and 28 respectively, which are twice, three-times and four times that of $m=1$. Accordingly, character pattern information of $2n$-bits, $3n$-bits and $4n$-bits can be completely sent out during one circulating period of each circulating memory corresponding to $n$-pulse periods of the clock pulse train $C_1$. OR gate 41, 42 and 43 provide logical OR outputs of data selectors in one designated address unit.

As mentioned above, when pattern information of one character is sent out, the address register 19 is at once reset by the timing pulse $t_6$, and a next address code word is derived from the information source 18 in response to the timing pulse $t_7$ to set it in the address register 19. The above operations are repeated until read data are completely read out from the information source 18.

It may be adoptable that data are not provided simultaneously in the information sources 1 and 18. If desirable, access operations to the information sources 1 and 18 may be alternately inhibited. If a special code word is provided in an information source and a signal to be employed for decoding the special code is applied to the terminals S, the information sources 1 and 18 can be replaced by only one information source which is automatically switched to the write mode or the read mode.

Connections in the gates 9, 16, 39, 25 and 29 are shown in case of $m=1$. In cases of $m=2$, $n=3$ or $m=4$, these gates are successively switched from the upper most terminal to one of successive lower terminals. The data distribution principle in the data distributers 2, 3 and 4 determines the scanning order in the scanners 26, 27 and 28. In case of $m=2$ by way of example, a first bit of the character pattern information of $2n$ bits is distributed to the memory block B$a$ or B$c$ of the font memory 17, and a second bit thereof is distributed to the memory block B$b$ or B$d$ of the font memory 17. Moreover, a third bit of the character pattern information of $2n$ bits is again distributed to the memory block B$a$ or B$c$. In other words, successive bits of the character pattern information of $2n$ display bits are alternately distributed to the memory blocks B$a$, B$c$ or the memory blocks B$b$, B$d$. Accordingly, the scanner 26 scans, in the same order, outputs of the two designated address blocks. Each of the scanners 26, 27 and 28 comprises a $m$-bit counter, and $m$ gates controlled in accordance with the counting state of the $m$-bit counter. The scanning order in each of the scanners 26, 27 and 28 is determined by the preset of the counter in response to the timing pulse $t_7$ and by the connection to the gates in accordance with the counting state of the counter.

Figure 5:
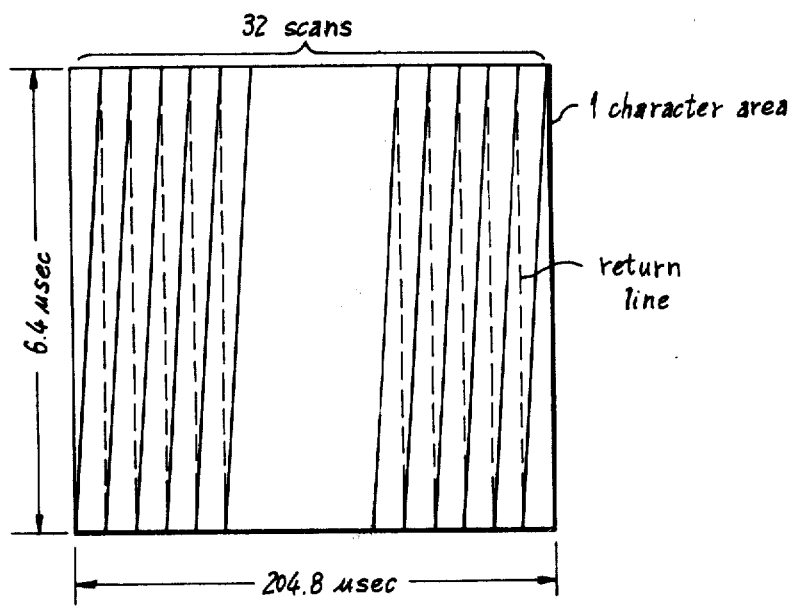
FIG. 5 is a diagram explanatory of the operation of a CRT display in which this invention is applied.

As an actual example of this invention, a character generator for CRT display was produced by the use of 4,096 dynamic recirculating shift registers of 512 bits. The scanning control on the CRT is performed as shown in FIG. 5. Character pattern information of 512 bits and character pattern information of 1024 bits were displayed on the CRT. In these tests, the latter provides displayed character patterns of extremely high quality. In accordance with the latter condition, 2,048 character patterns can be stored in the test device, while 4,096 character patterns can be stored in the former case of $m=1$. The bit density of 0.4 microsecond and the bit density of 0.2 micro-seconds are obtained in cases of $m=1$ and $m=2$ respectively, so that 16 bits and 32 bits are included in one scanning period in the same cases respectively. In each case, a character pattern is displayed in 2048 micro-seconds. In FIG. 5, a rectangular frame indicates an area of one character pattern on the CRT, so that this rectangular frame is not actually provided.

In Chinese character display, many types of character patterns are required. In this case, a small number of special character patterns essentially require the above mentioned extremely precise display of high bit density. It is uneconomical that a huge capacity of memory is provided for all the character patterns in addition to the above small number of special character patterns. This invention has merits, such as economy of memory capacity and a constant generation time of one character pattern for different numbers of bits.

Although this invention has been mainly described in connection with the character pattern generation and display, the present invention is similarly applicable to other figure patterns.

What I claim is:

1. A pattern information memory for storing a plurality of unit patterns, comprising:

font memory means having a total bit capacity of $n \cdot A$ and comprising a number A of circulating memories each having a rewritable $n$-bit capacity, each bit being capable of storing one dot obtained by dot decomposition from each unit pattern each unit pattern information including an address code;

switching means operatively connected to said font memory means for switching designated addresses in said font memory means in accordance with a value of a number $m$ ($m=1, 2, 3, \ldots$ less than the number A) to provide a memory capacity of $(n.A)/(n.m)$ patterns in combination of a number $m$ of said circulating memories per each pattern of $n \cdot m$ dots;

first control means controlled by said address code and operatively connected to said font memory means and said switching means for controlling said switching means to store each pattern information by making one access to a number $m$ of said circulating memories within a unit access time for one bit in a case: $m=1$; means providing a reading-out signal, said signal including a reading address code second control means controlled by said reading address code and operatively connected to said font memory means and said switching means for controlling said switching means to read out each stored pattern information by making one access to a number $m$ of said circulating memories within said unit access time for one bit in a case: $m=1$, whereby, the writing operation and the subsequently reading-out operation for each pattern information is each performed in a constant period of time irrespective of the value of the number $m$.

2. A pattern information memory according to claim 1, in which said switching means comprises a plurality of gates which are controlled by said address codes included by corresponding pattern information and in said reading address codes.

* * * * *